United States Patent
Tatsumi et al.

(10) Patent No.: US 8,907,722 B2
(45) Date of Patent: Dec. 9, 2014

(54) TRAVELING WAVE AMPLIFIER WITH SUPPRESSED JITTER

(71) Applicant: Sumitomo Electric Industries, Ltd., Osaka-shi (JP)

(72) Inventors: Taizo Tatsumi, Yokohama (JP); Keiji Tanaka, Yokohama (JP); Sosaku Sawada, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 51 days.

(21) Appl. No.: 13/895,920

(22) Filed: May 16, 2013

(65) Prior Publication Data

US 2013/0307619 A1 Nov. 21, 2013

(30) Foreign Application Priority Data

May 16, 2012 (JP) .................... 2012-112354

(51) Int. Cl.
*H03F 3/68* (2006.01)
(52) U.S. Cl.
USPC ............ 330/54; 330/43; 330/295; 330/124 R; 330/51

(58) Field of Classification Search
USPC ............................ 330/54, 43, 295, 124 R, 51
IPC .......................................................... H03F 3/68
See application file for complete search history.

(56) References Cited

U.S. PATENT DOCUMENTS

| | | | | |
|---|---|---|---|---|
| 7,215,196 | B2* | 5/2007 | Banba et al. ................... | 330/254 |
| 7,271,657 | B2* | 9/2007 | Friedrich et al. .............. | 330/286 |
| 7,279,980 | B2* | 10/2007 | Heydari et al. ............... | 330/286 |
| 8,010,825 | B2* | 8/2011 | Tamura ......................... | 713/503 |
| 8,150,270 | B2* | 4/2012 | Bonthron ...................... | 398/188 |
| 2008/0218257 | A1* | 9/2008 | Lee ............................... | 327/561 |

FOREIGN PATENT DOCUMENTS

| | | |
|---|---|---|
| JP | 09-130170 A | 5/1997 |
| JP | 2010-272918 A | 12/2010 |

* cited by examiner

*Primary Examiner* — Patricia Nguyen
(74) *Attorney, Agent, or Firm* — Venable LLP; Michael A. Sartori

(57) ABSTRACT

A traveling wave amplifier (TWA) with suppressed jitter is disclosed. The TWA includes a plurality of unit amplifiers with the differential arrangement comprised of a pair of transistors and a cascade transistors connected in series to the switching transistors. The unit amplifiers further includes current sources to provide idle currents to the cascade transistors. Even when the switching transistors fully turn off, the idle currents are provided to the cascade transistors, which set the operating point of the cascade transistor in a region where an increase of the base-emitter resistance is suppressed.

13 Claims, 11 Drawing Sheets

TRAVELING WAVE AMPLIFIER WITH SUPPRESSED JITTER

BACKGROUND OF THE INVENTION

1. Field of the Invention

The present invention in an aspect thereof relates to a travelling wave amplifier (TWA), in particular, relates to a TWA with suppressed jitter.

2. Related Background Art

One type of optical transmitter often implements with an optical signal source including, for instance, a semiconductor laser diode (LD), an optical modulator type of the electro-absorption (EA) modulator or the Mach-Zhender (MZ) modulator, and a driver to drive the optical modulator. An optical transmitter whose operation speed reaches 25 Gbps, 40 Gbps and so on, sometimes exceeds these speed, is necessary for rising and falling times of an optical output therefrom less than 10 picoseconds (ps). A driver to drive such an optical modulator is inevitably requested for a wide frequency band. An amplifier, or a driver with the configuration of, what is called, the travelling wave amplifier (TWA) is one of the best solutions for the wide band amplifier.

A TWA implemented with, what is called, hetero-bipolar transistor (HBT) has become popular in the field. Especially, an HBT with the cascade connection, namely, an HBT with another HBT connected in series to the former one has been used for a TWA application. However, the cascade connection sometimes brings a substantial jitter in an output thereof.

SUMMARY OF THE INVENTION

One aspect of the present application relates to a travelling wave amplifier (TWA) that includes a plurality of unit amplifiers, an input terminal, an output terminal, an input delay line connected to the input terminal, and an output delay line connected to the output terminal. Each of unit amplifiers are connected in parallel between the input delay line and the output delay line, receives an input signal with an input delay from the input terminal, the input delay being specific to the unit amplifiers and different from other input delays, and outputs an output signal with an output delay to the output terminal, the output delay being specific to the unit amplifiers and different from other output delays. Each of unit amplifiers includes a differential circuit having a pair of switching transistors and a pair of cascade transistors connected in series to the switching transistors, and current providers for providing idle currents to the cascade transistors when the switching transistor turns off.

Another aspect of the present application relates to a driver for driving an electro-absorption (EA) modulator. The driver includes a plurality of unit amplifiers each having a differential arrangement, a pair of input delay lines each connected to input terminals, a pair of output delay lines, at least one of output delay lines being connected to an output terminal. Each of the unit amplifiers receives input signals complementary to each other from the input delay lines with an input delay specific to respective unit amplifiers, and outputs amplified signals complementary to each other to the output terminal with an output delay specific to respective unit amplifiers. Each of the unit amplifiers includes a differential circuit including a pair of switching transistors and a pair of cascade transistors, the switching transistors and the cascade transistors being connected in series, and a pair of current providers for providing idle currents to respective cascade transistors when the switching transistors turn off.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF THE PREFERRED EMBODIMENTS

Next, some preferred embodiments according to the present invention will be described as referring to drawings. In the description of the drawings, numerals or symbols same or similar to each other will refer to elements same or similar to each other without overlapping explanations.

Figure 1:
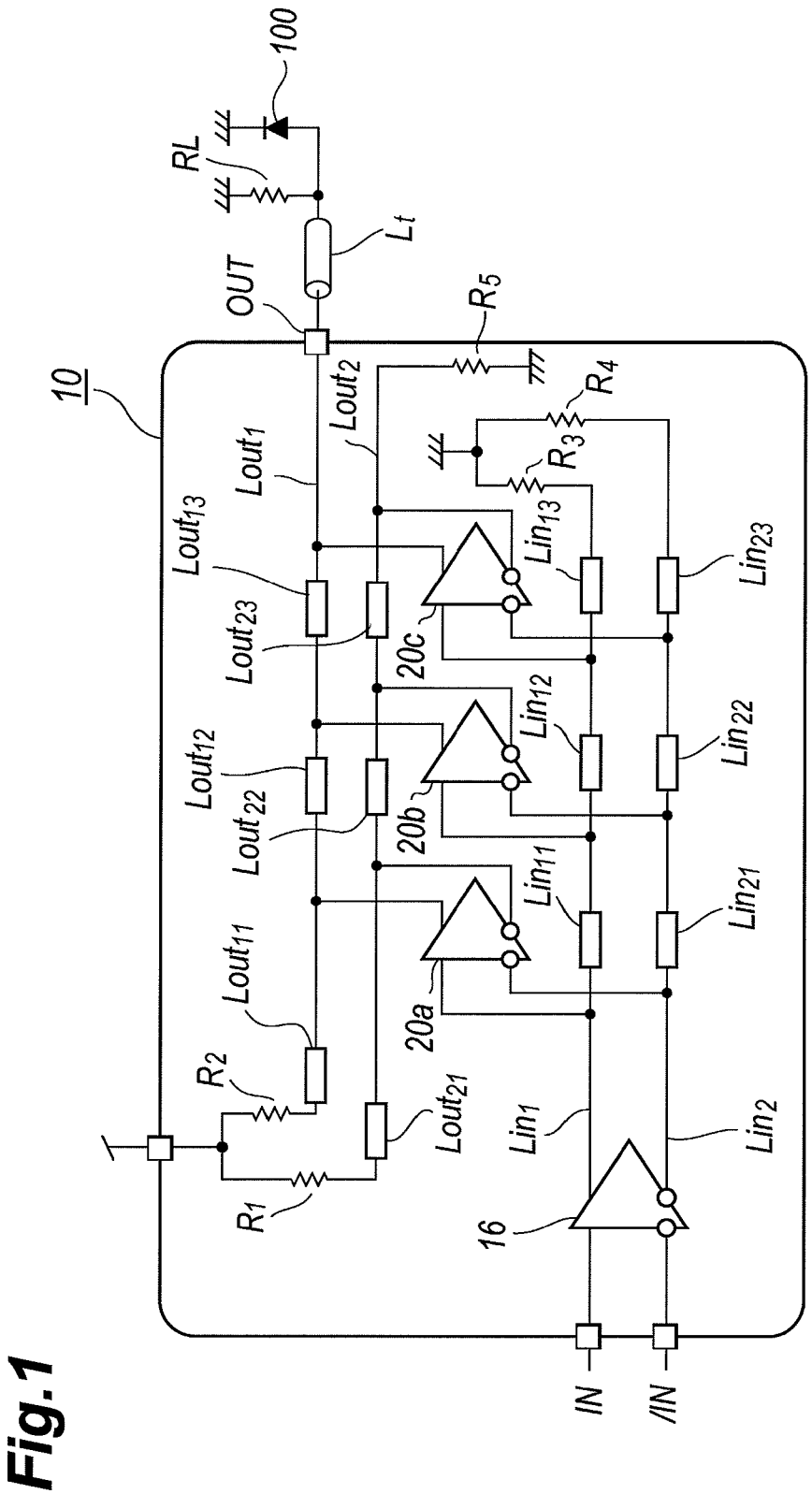
FIG. 1 is a circuit diagram of a TWA according to an embodiment of the invention.
Figure 2:
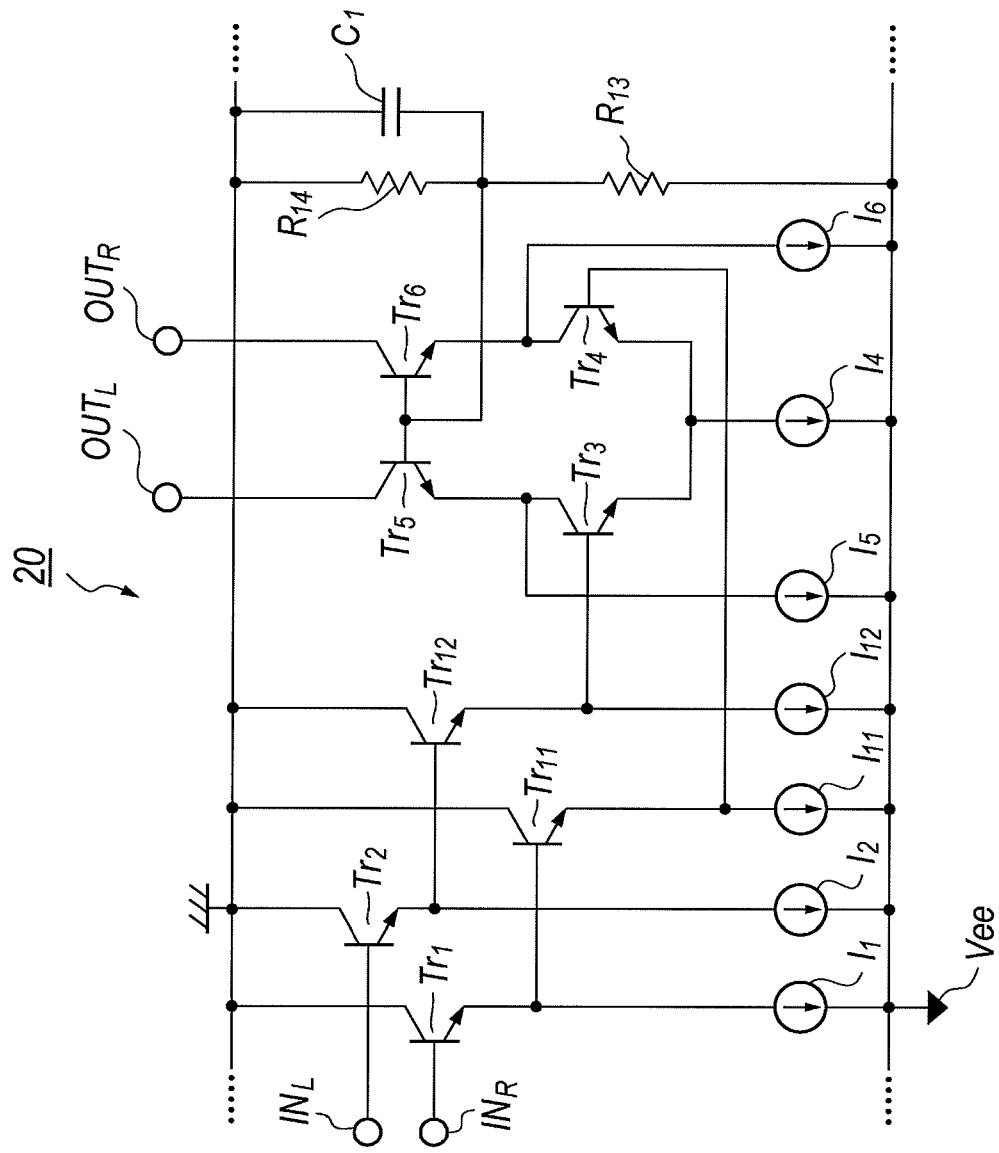
FIG. 2 shows a circuit diagram of a differential circuit adequate to respective unit amplifiers of the TWA 10 shown in FIG. 1.

FIG. 1 is a circuit diagram of a TWA 10 according to an embodiment of the invention, and FIG. 2 shows a circuit diagram of a differential circuit 20 implemented with the TWA 10 as respective unit amplifiers, 12a to 12c. The TWA 10 of the embodiment is usable for driving optical modulator types of, for instance, the electro-absorption (hereafter denoted as EA). The EA modulator 100 shown in FIG. 1 is connected in parallel to a terminator $R_L$, namely, a parallel circuit of the EA 100 and the terminator $R_L$ is coupled with the TWA 10 in the output thereof OUT through a transmission line Lt.

The TWA 10 includes a plurality of unit amplifiers, 12a to 12c, input transmission lines, $Lin_1$ and $Lin_2$, and output transmission lines, $Lout_1$ and $Lout_2$. The unit amplifiers, 12a to 12c, of the present embodiment are configured with a differential circuit. Although the number of the unit amplifiers is three (3) in the present embodiment, this number is optional; four or more unit amplifiers are available for the TWA 10. The input transmission lines, $Lin_1$ and $Lin_2$, and the output transmission lines, $Lout_s$ and $Lout_2$, adjust the delay thereof depending on the number of the unit amplifies, $12a$ to $12c$.

The input transmission lines, $Lin_1$ and $Lin_2$, couple with respective input terminals, IN and /IN, in one end thereof to receive driving signals complementary to each other through the pre-amplifier 16, where a slash "/" means that a signal or an element accompanying with this slash "/" has a phase opposite to a signal or element subsequent to and without this slash. The other end of the input transmission lines, $Lin_1$ and $Lin_2$, are terminated by resistors, $R_3$ and $R_4$, to the ground.

The output transmission line $Lout_1$ couples with an output terminal OUT in one end thereof, while, the other end thereof is terminated by a resistor $R_2$ to the ground. The other of the output transmission lines $Lout_2$ is terminated by a resistor $R_5$ to the ground in a side of the output terminal OUT, while, the other end thereof is terminated by a resistor $R_1$ to the ground.

The TWA 10 of the embodiment shown in FIG. 1 further provides a pre-amplifier 16 put between the input transmission lines, $Lin_1$ and $Lin_2$, and the input terminals, IN and /IN. Specifically, the non-inverting input of the pre-amplifier 16 couples with one of the input terminals IN; while, the inverting input of the pre-amplifier 16 couples with the other input terminal /IN. The non-inverting output thereof couples with one of the transmission lines $Lin_1$ and the inverting output couples with the other of the input transmission lines $Lin_2$. Thus, an in-phase signal provided to one of the input terminals IN is amplified by the pre-amplifier 16 and provided on the input transmission line $Lin_1$, while, another signal whose phase is opposite to the former one and incoming to the other input terminal /IN is also amplified by the pre-amplifier 16 and provided on the other of the input transmission line $Lin_2$.

The unit amplifiers, $12a$ to $12c$, each has the configuration of, what is called, the differential circuit whose inputs couple with respective input transmission lines, $Lin_1$ and $Lin_2$, but receives differential signals with a delay time specific to a unit amplifier and different from others. The non-inverting input of respective unit amplifiers, $12a$ to $12c$, couples with one of the input transmission lines $Lin_1$; while, the inverting input of respective unit amplifiers, $12a$ to $12c$, couples with the other of the input transmission line $Lin_2$.

Also, the unit amplifiers, $12a$ to $12c$, in the outputs thereof couple with the output transmission lines, $Lout_1$ and $Lout_2$, and output amplified signals with a delay time specific thereto and different from others. Specifically, the non-inverting output of the unit amplifiers, $12a$ to $12c$, couple with one of the output transmission lines $Lout_1$; while, the inverting output of respective unit amplifiers, $12a$ to $12c$, couple with the other of the output transmission line $Lout_2$.

Thus, the unit amplifiers, $12a$ to $12c$, receive the in-phase signal from the pre-amplifier 16 through the input transmission line $Lin_1$ and output the in-phase signal to the output transmission line $Lout_1$. Also, the unit amplifiers, $12a$ to $12c$, receive the reverse phase signals from the pre-amplifier 16 through the other of the input transmission line $Lin_2$, and output reverse phase signals to the other of the output transmission line $Lout_2$.

A feature of the TWA 10 is that each of the unit amplifiers, $12a$ to $12c$, receives the differential signals from the pre-amplifier 16 with a delay specific thereto. The specific delay is determined by delay lines put between the input terminals of the unit amplifiers, exactly, from the outputs of the preamplifier 16 to respective unit amplifies, $12a$ to $12c$, namely, input delay lines, $Lin_{11}$ to $Lin_{23}$. Further exactly, the delay time depends on inductance and capacitance inherently attributed to the input delay lines, $Lin_{11}$ to $Lin_{23}$.

The input delay line $Lin_{11}$ is a type of the transmission line put between the non-inverting inputs of the unit amplifier $12a$ and that of the next unit amplifier $12b$, a delay of which is determined by the input capacitance of the unit amplifier $12b$, the inductance and the capacitance of the delay line $Lin_{11}$. Another input delay line $Lin_{21}$ is also the type of the transmission line put between the inverting input of the unit amplifier $12a$ and that of the next unit amplifier $12b$, where the delay time thereof is determined by the input capacitance of the amplifier $12b$, the inductance and the capacitance of the delay line $Lin_{21}$.

Situations for other delay lines, $Lin_{12}$ to $Lin_{23}$, are similar to those for the delay lines, $Lin_{11}$ and $Lin_{21}$, described above. That is, a delay time of the delay lines, $Lin_{12}$ and $Lin_{22}$, are determined by the input capacitance of the third amplifier $12c$, and the inductance and the capacitance of respective delay lines, $Lin_{12}$ to $Lin_{22}$. For delay lines, $Lin_{13}$ and $Lin_{23}$, a delay time thereof is determined only by the inductance and the capacitance of the delay lines.

The output delay lines, $Lout_{12}$ and $Lout_{22}$, are put between the output of the first unit amplifier $12a$ and that of the second unit amplifier $12b$, where a delay time thereof depends on the output capacitance of the first unit amplifier $12a$ and the inductance and the capacitance of the delay lines, $Lout_{12}$ and $Lout_{22}$. Situations same to the delay lines, $Lout_{12}$ and $Lout_{22}$, described above correspond to the delay lines, $Lout_{13}$ and $Lout_{23}$. For the delay lines, $Lout_{11}$ and $Lout_{21}$, a delay time thereof are determined only by the inductance and the capacitance of the delay lines, $Lout_n$ and $Lout_{21}$.

In the TWA 10, the delay times of the delay lines, $Lin_{11}$ to $Lin_{22}$, and $Lout_{12}$ to $Lout_{23}$, are set to be equal to each other. Accordingly, propagation times from the outputs of the pre-amplifier 16 to the output terminal OUT are independent of the paths; that is, the propagation time through the first unit amplifier $12a$, that through the second unit amplifier $12b$, and that through the third unit amplifier $12c$, are equal assuming that three unit amplifiers, $12a$ to $12c$, have a propagation time same to each other. Setting the delay time of respective delay lines, $Lin_{11}$ to $Lin_{22}$, and $Lout_{12}$ to $Lout_{23}$, is $t_{dl}$ and the propagation time of the unit amplifiers, $12a$ to $12c$, is $t_{da}$; the propagation time from the output of the pre-amplifier 16 to the output terminal OUT becomes $2 \times tdl + tda$. Then, the signals each passing through respective unit amplifiers, $12a$ to $12c$, align the phase thereof at the output terminal OUT.

Referring to FIG. 2, each of the unit amplifier, $12a$ to $12c$, has the differential circuit 20 including transistors, $Tr_1$ to $Tr_6$, a capacitor $C_1$, resistors, $R_{13}$ and $R_{14}$, and current sources, $I_1$ to $I_6$. The differential circuit 20 amplifies input signals complementary to each other and provided in the input terminals, $IN_L$ and $IN_R$, and outputs amplified signals also complementary to each other in the output terminals, $OUT_L$ and $OUT_R$.

Transistors, $Tr_1$, $Tr_2$, $Tr_{11}$, and $Tr_{12}$ and current sources, $I_1$, $I_2$, $I_{11}$, and $I_{12}$, constitute a two stage emitter-follower to lowers a level of input signals by twice of the forward bias voltage of a junction diode, which substantially becomes about 2.0 V in the present embodiment. Transistors, $Tr_3$ and $Tr_4$, and the current source $I_4$ constitute a differential circuit. That is, a pair of transistors, $Tr_3$ and $Tr_4$, which are often called as the switching transistor, receives the outputs of the two-stage emitter follower, namely, the emitters of the transistors, $Tr_{11}$ and $Tr_{12}$. Each of the switching transistors, $Tr_3$ and $Tr_4$, in the collectors thereof, couples with respective transistors, $Tr_5$ and $Tr_6$. That is, the collector of the transistor $Tr_3$ couples with the emitter of the transistor $Tr_5$, and the collector of the other transistor $Tr_4$ couples with the emitter of the Transistor $Tr_6$. Thus, transistors, $Tr_5$ and $Tr_6$, are connected in series to respective switching transistors, $Tr_3$ and $Tr_4$. This arrangement is often called as the cascade configuration, and the transistors, $Tr_5$ and $Tr_6$, are often called as the cascade transistor. The emitters of the switching transistors, $Tr_3$ and $Tr_4$, are commonly connected to the current source $I_4$.

The collector of one of the cascade transistor $Tr_5$ couples with the output $OUT_L$, while the collector of the other cascade transistor $Tr_6$ couples with the other output $OUT_R$. The bases of the cascade transistors, $Tr_5$ and $Tr_6$, are commonly biased by the divider including two resistors, $R_{13}$ and $R_{14}$, where they are connected in series between the ground and the power supply $V_{ee}$. The differential circuit 20 shown in FIG. 2 implements with transistors, at least switching transistors, $Tr_3$ and $Tr_4$, are the type of the double-hetero bipolar transistor (DHBT) made of compound semiconductor materials lattice-matched with the indium phosphide (InP).

One feature of the differential circuit 20 is that the differential circuit 20 further provides current sources, $I_5$ and $I_6$, each connected between the collector of the switching transistors, $Tr_3$ and $Tr_4$, and the emitter of the cascade transistors, $Tr_5$ and $Tr_6$. The current sources, $I_5$ and $I_6$, divide the currents flowing in respective cascade transistors, $Tr_5$ and $Tr_6$, from the switching transistors, $Tr_3$ and $Tr_4$, by 0.01 to 1 mA independent on turning on or off of the switching transistors, $Tr_3$ and $Tr_4$.

Figure 3:
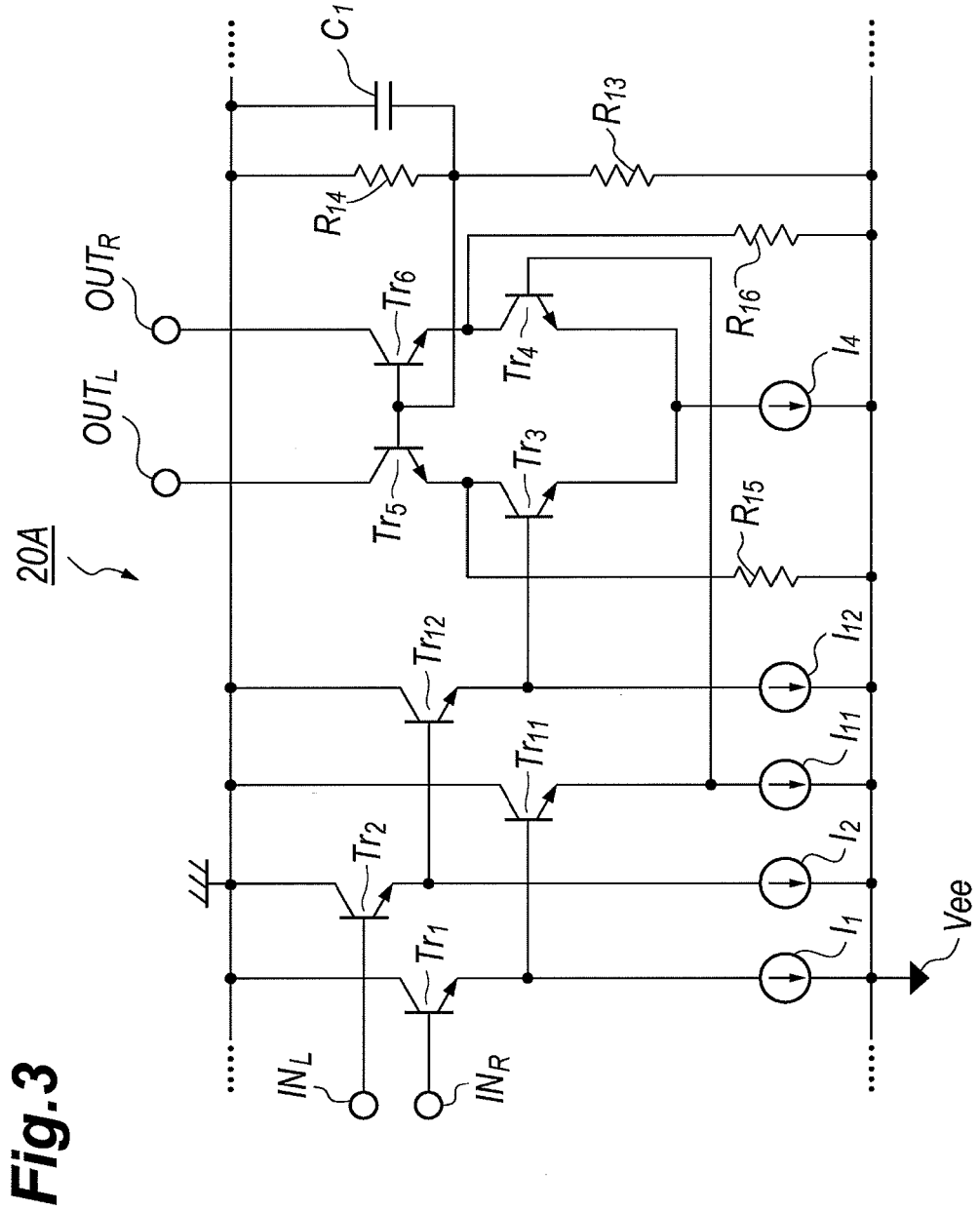
FIG. 3 is a circuit diagram of a differential circuit modified from the differential circuit shown in FIG. 2.

FIG. 3 is a circuit diagram of a differential circuit 20A modified from the aforementioned circuit 20 shown in FIG. 2. The modified differential circuit 20A provides, as a substitute for the current sources, $I_5$ and $I_6$, two resistors, $R_{15}$ and $R_{16}$, that pull the collectors of the switching transistors, $Tr_3$ and $Tr_4$, or the emitters of the cascade transistors, $Tr_5$ and $Tr_6$, down to the negative power supply $V_{ee}$. The resistors, $R_{15}$ and $R_{16}$, preferably has resistance of, for instance, 1 to 200 kΩ, which is equivalent to a condition where a current of 0.01 to 1 mA flows in respective resistors, $R_{15}$ and $R_{16}$, when they are biased by 1 to 2 V. The resistors, $R_{15}$ and $R_{16}$, have resistance far greater than that of an equivalent resistance $R_{be}$ between the base and the emitter of the bipolar transistor; accordingly, the resistors, $R_{15}$ and $R_{16}$, operate as a stable current source for the cascade transistors, $Tr_5$ and $Tr_6$.

Figure 4:
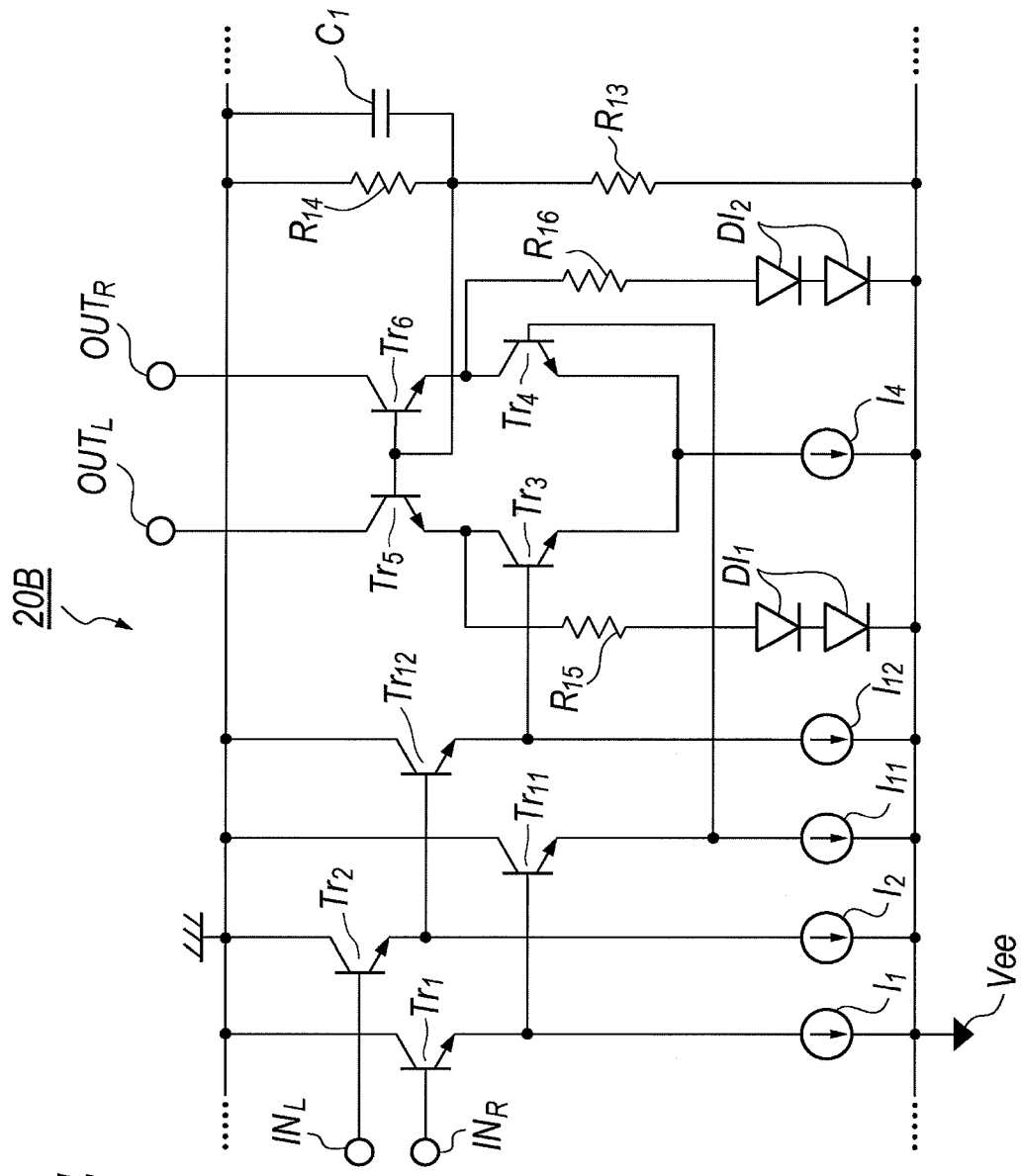
FIG. 4 is a circuit diagram of a differential circuit still modified from the differential circuit shown in FIG. 2.

FIG. 4 shows a circuit diagram of a differential circuit 20B still modified from that shown in FIG. 2. The differential circuit 20B implements, as a substitution of the current sources, $I_5$ and $I_6$, in FIG. 2, a circuit block including two diodes, $DI_1$ and $DI_2$, and a resistor each connected in series. Two diodes connected in series bring a voltage drop of slightly less than 2.0 V. Accordingly, another voltage drop necessary in resistors, $R_{15}$ and $R_{16}$, becomes small, which means that, when the current of 0.01 to 1 mA flows therein, the resistors, $R_{15}$ and $R_{16}$, is unnecessary to have the resistance of several tenses and hundreds kilo-ohms (kΩ), which means that, when the resistors are monolithically integrated with the transistors, lateral dimensions of the resistors, $R_{15}$ and $R_{16}$, becomes small. The number of diodes, $DI_1$ and $DI_2$, connected in series is optionally determined by the magnitude of the current necessary for bypassing the switching transistors, $Tr_3$ and $Tr_4$, and the resistance of the resistors, $R_{15}$ and $R_{16}$.

The differential circuits, 20 to 20B, thus described implement circuit blocks, namely, the current sources, $I_5$ and $I_6$, resistors, $R_{15}$ and $R_{16}$, and diodes, $DI_1$ and $DI_2$, to bypass the current flowing in the cascade transistors, $Tr_5$ and $Tr_6$, independent of ON/OFF operations of the switching transistors, $Tr_3$ and $Tr_4$, which means that at least the current flowing in the circuit blocks always flows in the cascade transistors, $Tr_5$ and $Tr_6$. Accordingly, the bypass current prevents the cascade transistors, $Tr_5$ and $Tr_6$, from delayed response. The TWA 10 may effectively reduce the jitter appeared in the output OUT thereof.

The operation of the TWA 10 will be further described in detail.

First, a differential circuit 920 shown in FIG. 8, which is comparable to the differential circuit of the embodiment, will be described. The differential circuit 920 has the same arrangement with the amplifier 20 shown in FIG. 2 except for the bypass current sources, $I_5$ and $I_6$. The comparable differential circuit 920 possibly causes a jitter for large input signals to turn on and off the switching transistors, $Tr_3$ and $Tr_4$, completely.

Figure 9:
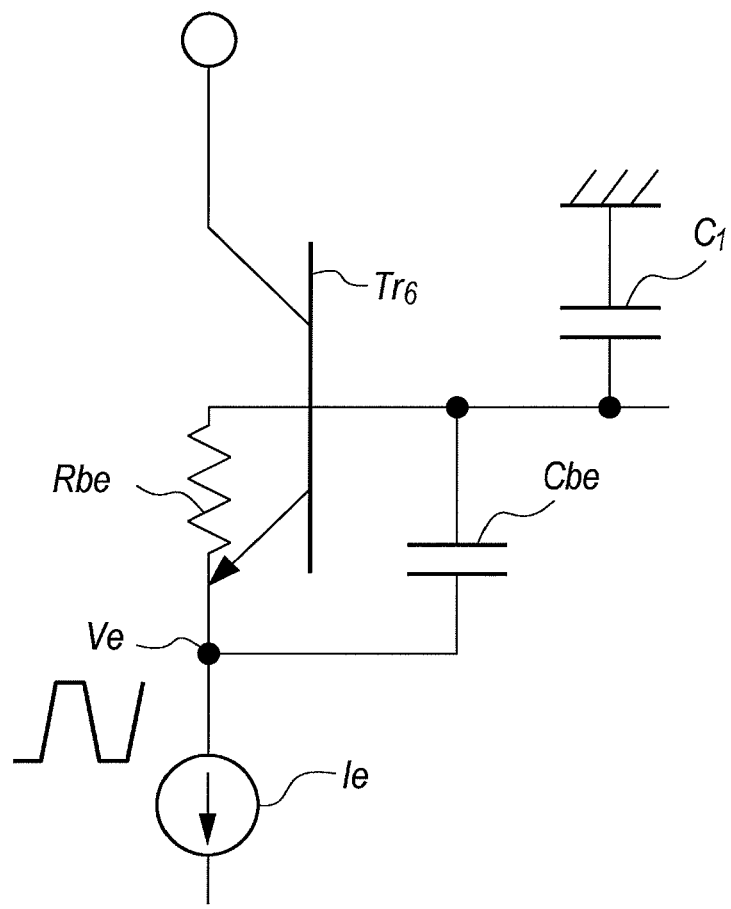
FIG. 9 is an equivalent circuit of the cascade transistor and peripheries thereof.
Figure 10A:
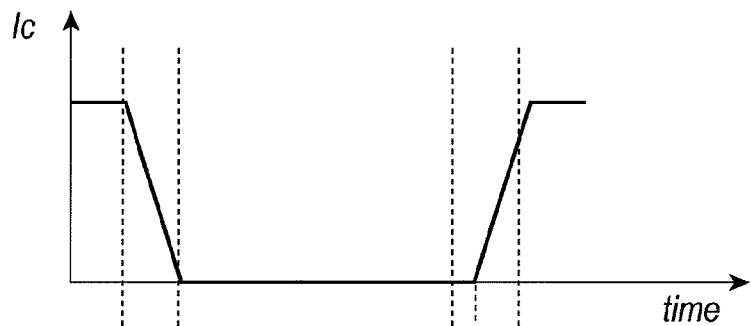
FIG. 10A to 10C show time behaviors of the collector current $I_e$, the emitter level $V_e$ and the emitter current $I_e$ of the cascade transistor, respectively.
Figure 10B:
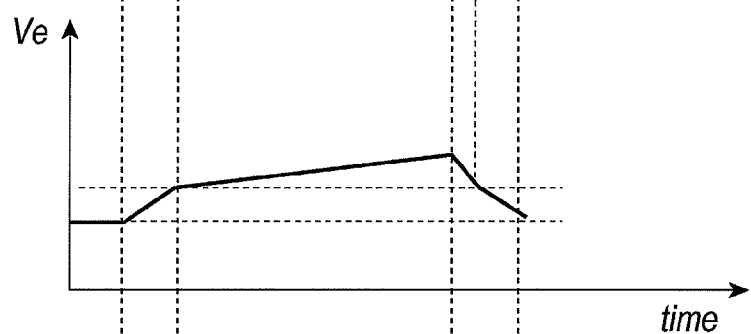
Figure 10C:
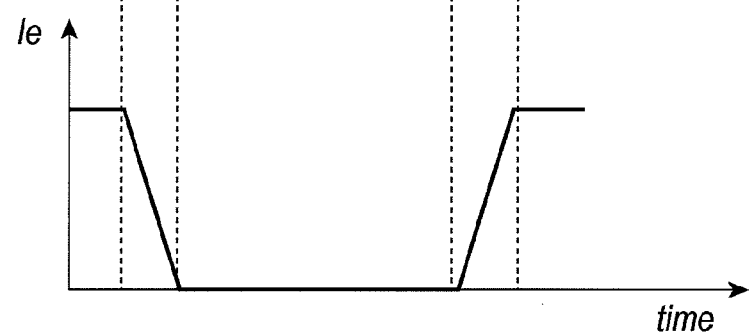

FIG. 9 is an equivalent circuit of the cascade transistor $Tr_6$ and peripheries thereof, which includes an emitter current source $I_e$, a resistor between base and emitter $R_{be}$, and a capacitance $C_{be}$ between base and emitter. FIG. 9 also includes an external capacitor $C_1$ put between base and the ground. FIGS. 10A to 10C show behaviors of the collector current $I_c$, the emitter voltage $V_e$, and the emitter current $I_e$, respectively, where the emitter current $I_e$ is same with the collector current of the switching transistor $Tr_4$. When the signal input to the differential circuit has a large swing voltage, the switching transistor $Tr_4$ fully turns off and the collector current thereof (the emitter current $I_e$ of the transistor $Tr_6$) reduces to several micro-ampere (μA) or less.

Figure 11:
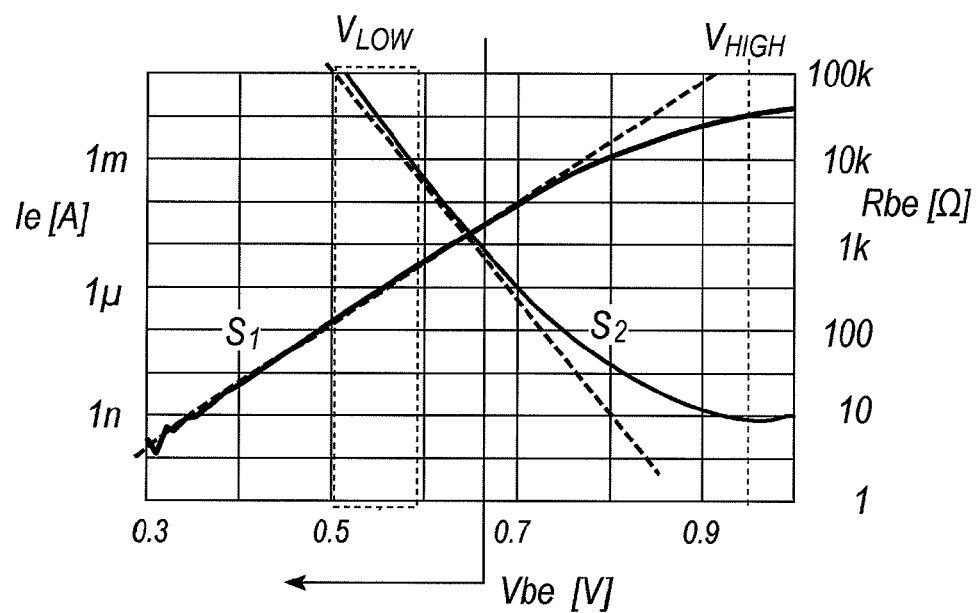
FIG. 11 shows typical relations of the emitter current $I_e$, the behavior $S_1$, and the base-emitter resistance $R_{be}$, the behavior $S_2$, of the cascade transistor against the base-emitter voltage $V_{be}$.

Moreover, FIG. 11 shows typical relations of the emitter current $I_e$, marked by $S_1$, and the base-emitter resistance $R_{be}$, marked by $S_2$, of the cascade transistor $Tr_6$ against the base-emitter voltage $V_{be}$.

Because the emitter current $I_e$ of an HBT against the base-emitter voltage $V_{be}$ follows a relation of a forwardly biased diode; the emitter current $I_e$ is given by in a region where the emitter resistance of a transistor is ignorable:

$$I_e = I_{e0} \times \{\exp(q \times V_{be}/k \times T) - 1\}, \quad (1)$$

where q, k, T, and $I_{e0}$ are elementary charge, Boltzmann constant, absolute temperature and a constant, respectively. Then, the base-emitter resistance $R_{be}$ is given by:

$$R_{be} = \partial V_{be}/\partial I_e \quad (2)$$
$$= k \times T/(q \times I_{e0}) \times \exp(-q \times V_{be}/k \times T).$$

Thus, the base-emitter resistance $R_{be}$ exponentially increases as the base-emitter voltage $V_{be}$ decreases, as the behavior $S_2$ shown in FIG. 11. On the other hand, the emitter resistance of the transistor $Tr_6$ becomes dominant compared with the base-emitter resistance $R_{be}$ in a region where the large emitter current $I_e$ flows, for instance, in a region where the base-emitter voltage $V_{be}$ exceeds 0.8 V.

When the switching transistor $Tr_4$ fully turns on, the collector current $I_c$ thereof reaches 10 mA, the base-emitter voltage $V_{be}$ becomes around 0.95 V, and the base-emitter resistance $R_{be}$ becomes about 1Ω, where these conditions correspond to the base-emitter voltage $V_{be}$ of $V_{HIGH}$ in FIG. 11. On the other hand, when the switching transistor $Tr_4$ fully turns off to reduce the collector current thereof to only about 1 the base-emitter voltage $V_{be}$ decreases to around 0.55 V and the base-emitter resistance $R_{be}$ exceeds 1 kΩ, as shown by regions $V_{LOW}$ in FIG. 11.

A resistor with the base-emitter resistance $R_{be}$ accompanies with the capacitor with the base-emitter capacitance $C_{be}$ of about 0.1 pF. Increasing the base-emitter resistance $R_{be}$ as the base-emitter voltage $V_{be}$ decreases, the time constant of the parallel circuit of the resistor $R_{be}$ and the capacitor $C_{be}$ decreases, where this brings a gradual increase of the emitter voltage $Y_e$ as shown in FIG. 10B. As the switching transistor $Tr_4$ turns on, namely, the emitter current $I_e$ flows out from the cascade transistor $Tr_6$, the emitter voltage of the transistor $Tr_6$ gradually decreases until the base-emitter resistance $R_{be}$ enters in a region $V_{HIGH}$ in FIG. 11, then the transistor $Tr_6$ turns on to flow the collector current $I_c$ therein.

During a slight period for the base-emitter resistance $R_{be}$ to vary from a relatively larger resistance to a relatively smaller one, the timing at which the collector current of the cascade transistor $Tr_6$ turns on delays. Bipolar transistors, in particular, the type of InP-HBT, performances or characteristics thereof in a region where the base-emitter resistance $R_{be}$ is relatively larger are easily caused by conditions of the manufacturing process of transistors and the operating ambience. In particular, a TWA implements a plurality of amplifiers each connected in the outputs and the inputs thereof by transmission lines. A length of such transmission lines reaches and sometimes exceeds several millimeters (mm), which inevitably expands the physical size of the integrated circuit. Accordingly, it is hard to secure the uniformity in device characteristics and operating ambience, especially, an operating temperature of individual devices in such an expanded area. The time lag by which the base-emitter resistance $R_{be}$ recovers tends to scatter widely, which results in the jitter observed at the output terminal OUT of the TWA 10.

The time lag described above possibly occurs when an operating point of the transistor $Tr_6$ is set in a region where the base-emitter resistance $R_{be}$ becomes large. Such a region occurs when:
(1) the transistor $Tr_4$ is completely turns off and the emitter current $I_e$ of the cascade transistor $Tr_6$ becomes small enough, for instance, around 1 μA; and
(2) in particular, such a status of fully turning off the transistor continues for a long period, that is, a bit "0" or "1" successively appears.

Figure 8:
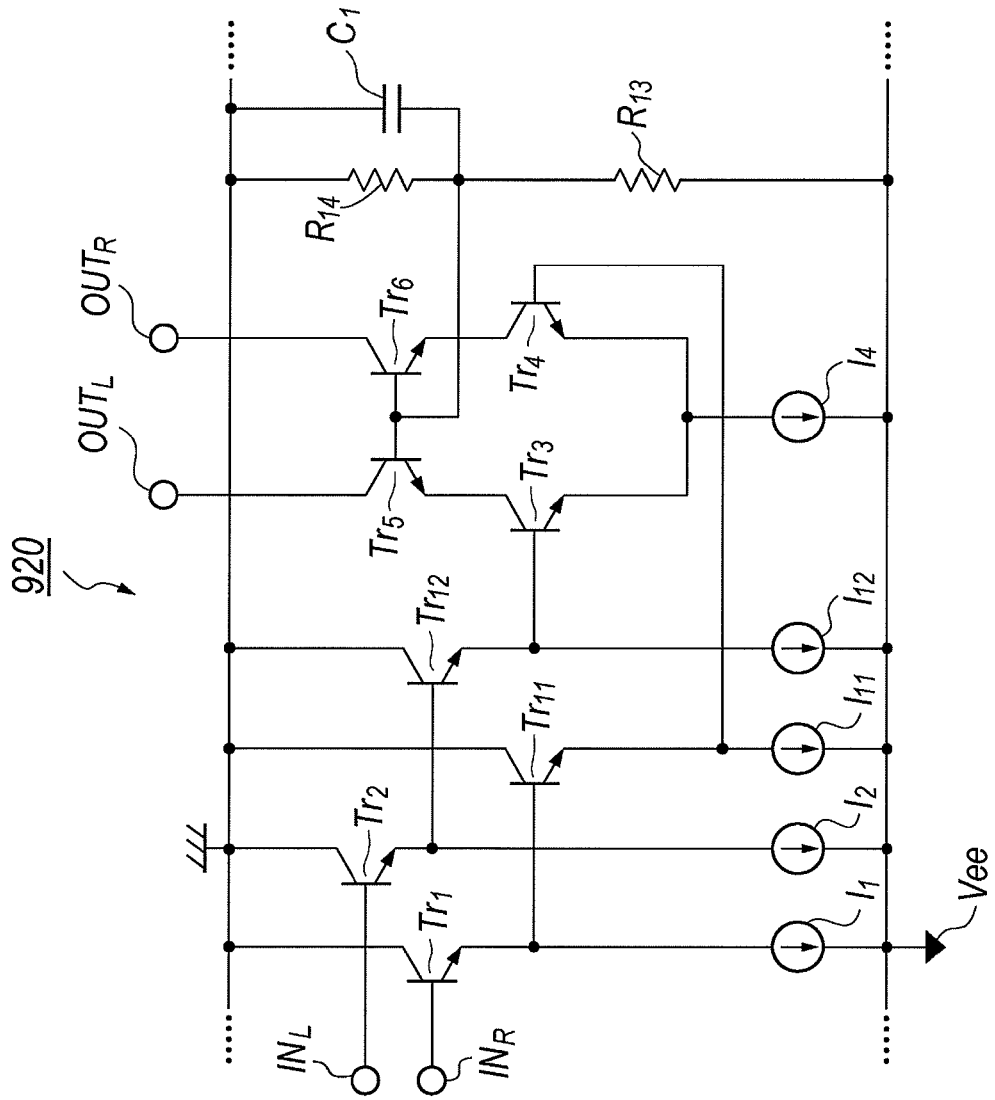
FIG. 8 is a circuit diagram of a differential circuit comparable to the differential circuit shown in FIG. 2.

When the differential circuit such as those shown in FIG. 8 is applied to a driver for an optical modulator, the output of the driver is necessary to be limited in an amplitude thereof to driver the optical modulator under preset conditions. Accordingly, switching transistors are fully turned on and off. On the other hand, the optical communication system often sets a data sequence that iterates the same status for 31 bits at longest. Thus, the differential circuit used in the optical communication system often encounters the two conditions above described.

Figure 5:
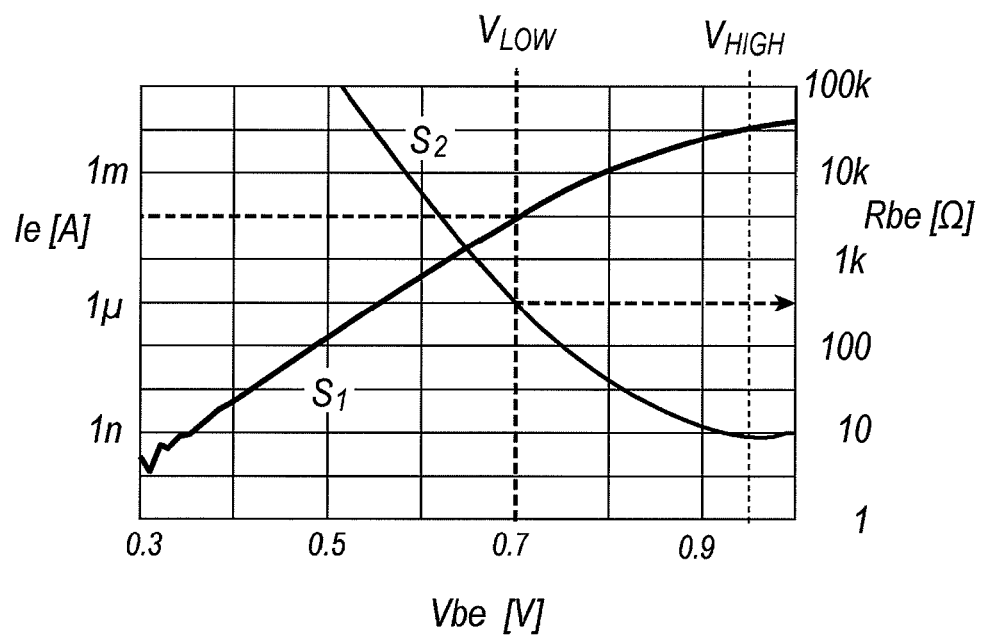
FIG. 5 shows typical relations of the emitter current $I_e$, $S_1$, and the base-emitter resistance $R_{be}$, $S_2$, of the cascade transistor against the base-emitter voltage $V_{be}$ thereof according to an embodiment of the invention.

The differential circuits, 20 to 20B, according to embodiments of the invention, as shown in FIGS. 2 to 4, provide current sources, $I_5$ and $I_6$, to flow bypass currents or idle currents in the cascade transistors, $Tr_5$ and $Tr_6$, even when the switching transistors, $Tr_1$ and $Tr_4$, fully turn off. Accordingly, the operating point of the cascade transistors, $Tr_5$ and $Tr_6$, are prevented to be set in the region where the base-emitter resistance $R_{be}$ becomes large. The increase of the base-emitter resistance $R_{be}$ is suppressed to around 100Ω, as shown in FIG. 5, where the current sources, $I_5$ and $I_6$, provide currents of 100 μA. Then, a recovery time for the base-emitter resistance $R_{be}$ from a larger value to a lower one is not only shortened but a scattering thereof is suppressed. The TWA 10 implementing with the differential driver, 20 to 20B, according to embodiments of the invention reduces a jitter.

Figure 6A:
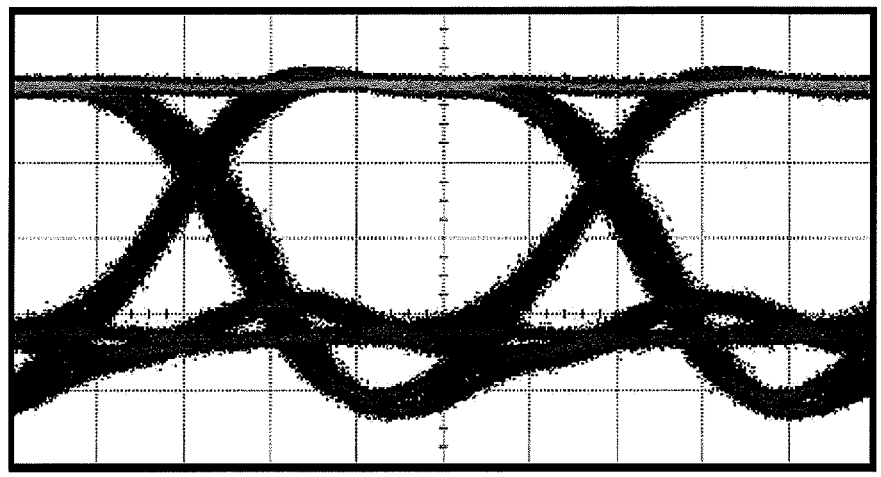
FIGS. 6A and 6B compare outputs of two TWAs by eye diagrams, one of which shown in FIG. 6A corresponds to that implementing with a comparable differential circuit shown in FIG. 8; while, the other shown in FIG. 6B corresponds to that implementing with the differential circuit shown in FIG. 2.
Figure 6B:
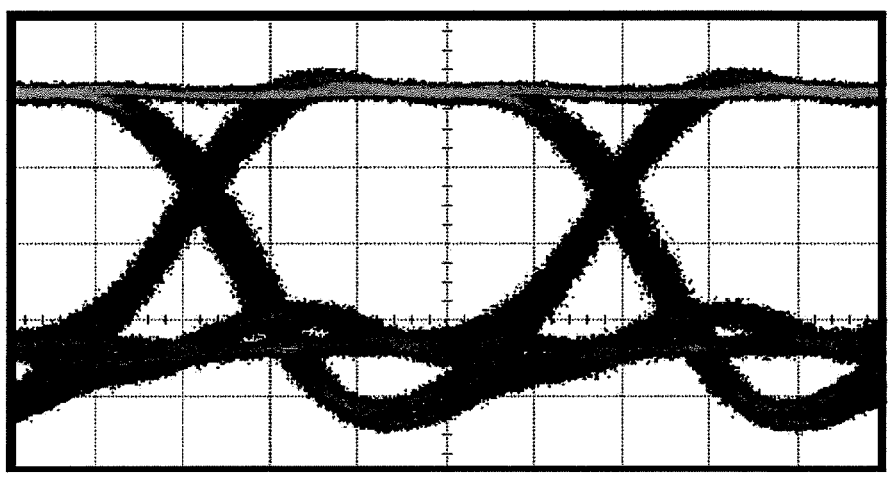

FIGS. 6A and 6B compare outputs of two TWAs, one of which shown in FIG. 6A implements with the comparable differential circuit 920 shown in FIG. 8, while, the other shown in FIG. 6B implements with the differential circuit 20. Two TWAs receive signals with a speed of 43 Gbps and a pseudo random bit sequence (PRBS) pattern of $2^{31}-1$. The eye diagram shown in FIG. 6A accompanies with a jitter of 850 femtosecond (fs) by the root-mean-square (RMS), while, that shown in FIG. 6B of the present invention shows a jitter of 785 fs RMS.

Figure 7:
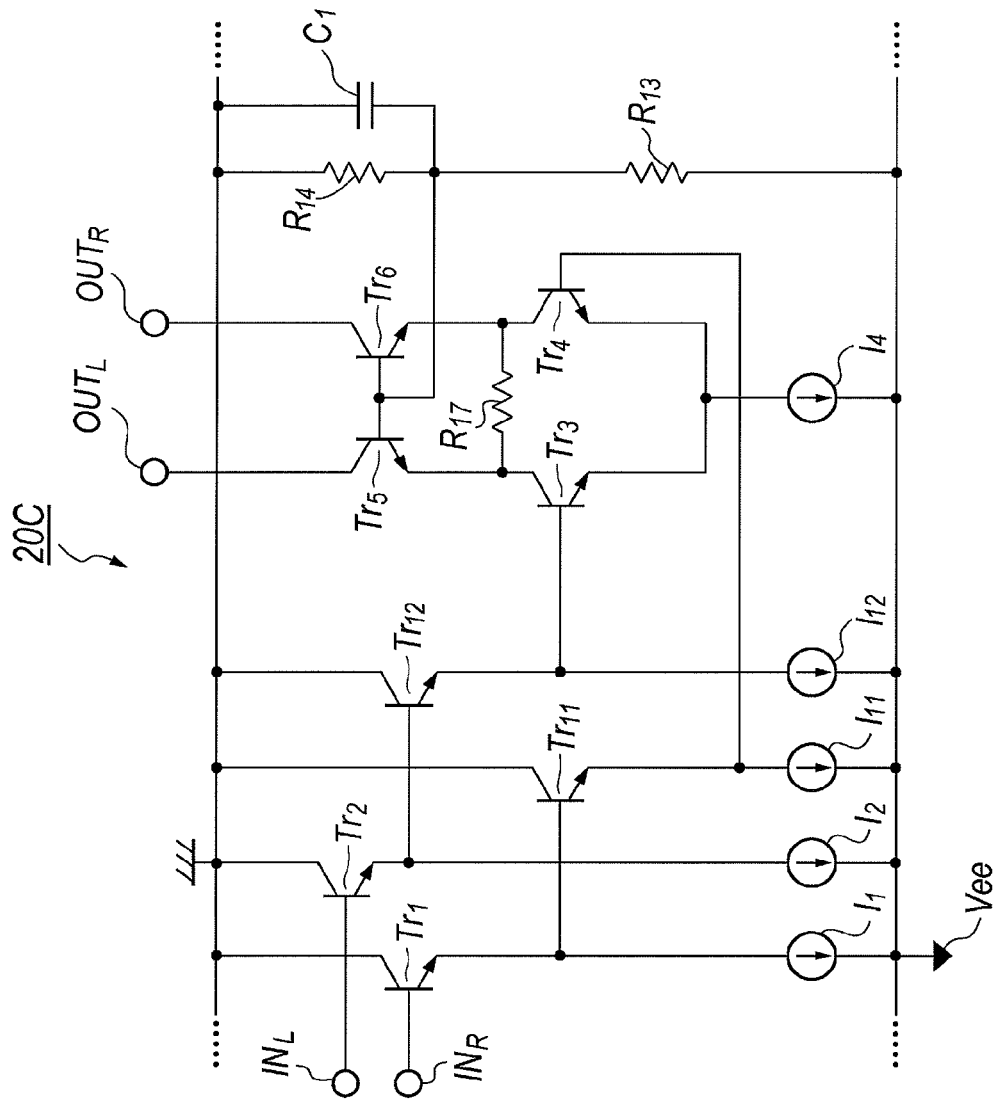
FIG. 7 is a circuit diagram of a differential circuit still modified from the differential circuit shown in FIG. 2.

While there has been illustrated and described what are presently considered to be example embodiments of the present invention, it will be understood by those skilled in the art that various other modifications may be made, and equivalents may be substituted, without departing from the true scope of the invention. For instance, the current sources, $I_5$ and $I_6$, are able to be replaced to other circuit to provide idle currents to the cascade transistors, $Tr_5$ and $Tr_6$. FIG. 7 shows still modified differential circuit 20C of the present invention. The differential circuit 20C implements with a resistor $R_{17}$ connecting both collectors of the transistors, $Tr_3$ and $Tr_4$; or both emitters of the cascade transistors, $Tr_5$ and $Tr_6$.

The resistance $R_{17}$ has resistance of 0.1 to 10 kn. When the transistor $Tr_4$ turns off but the other transistor $Tr_3$ turns on, an idle current provided from the emitter of the cascade transistor $Tr_6$ flows in the resistor $R_{17}$ to the collector of the transistor $Tr_3$. On the other hand, when the transistor $Tr_3$ turns off but the other transistor $Tr_4$ turns on, an idle current provided from the cascade transistor $Tr_y$ flows in the resistor $R_{17}$ to the transistor $Tr_4$. Assuming the base-emitter resistance $R_{be}$ is linear to the base-emitter bias, the idle current flowing in the resistor $R_{17}$ is given by:

$$I_{idle} = R_{be}/(R_{17}+R_{be}) \times I_c. \qquad (3)$$

Setting the resistance $R_{17}$ such that the idle current $I_{idle}$ is 0.01 to 1 mA, the resistor $R_{17}$ shows a function same with the current sources, $I_5$ and $I_6$.

Therefore, it is intended that the present invention not be limited to the particular embodiments disclosed, but that the invention include all embodiments falling within the scope of the appended claims.

What is claimed is:
1. A travelling wave amplifier (TWA), comprising:
a plurality of unit amplifiers;
an input terminal;
an output terminal;
an input delay line connected to the input terminal; and
an output delay line connected to the output terminal,
wherein each of unit amplifiers are connected in parallel between the input delay line and the output delay line, receives an input signal with an input delay from the input terminal, the input delay being specific to the unit amplifiers and different from other input delays, and outputs an output signal with an output delay to the output terminal, the output delay being specific to the unit amplifiers and different from other output delays, and
wherein each of unit amplifiers includes a differential circuit having a pair of switching transistors and a pair of cascade transistors connected in series to the switching transistors, and current providers for providing idle currents to the cascade transistors when the switching transistor turns off.
2. The TWA of claim 1,
wherein the current provider is a current source connected in parallel to the switching transistors and in series to the cascade transistors.
3. The TWA of claim 1,
wherein the current provider is a resistor connected in parallel to the switching transistors and in series to the cascade transistors.

4. The TWA of claim 3,
wherein the current provider further includes a diode connected in series to the resistor.

5. The TWA of claim 1,
wherein the current provider is a resistor connected between the switching transistors and between the cascade transistors.

6. A driver for driving an electro-absorption (EA) modulator, comprising:
a plurality of unit amplifiers each having a differential arrangement;
a pair of input delay lines each connected to input terminals;
a pair of output delay lines, at least one of output delay lines being connected to an output terminal,
wherein each of the unit amplifiers receives input signals complementary to each other from the input delay lines with an input delay specific to respective unit amplifiers, and outputs amplified signals complementary to each other to the output terminal with an output delay specific to respective unit amplifiers, and
wherein each of the unit amplifiers includes
a differential circuit including a pair of switching transistors and a pair of cascade transistors, the switching transistors and the cascade transistors being connected in series, and
a pair of current providers for providing idle currents to respective cascade transistors when the switching transistors turn off.

7. The driver of claim 6,
wherein the current provider includes a current source connected in parallel to the switching transistor and in series to the cascade transistor.

8. The driver of claim 6,
wherein the current provider includes a resistor connected in parallel to the switching transistor and in series to the cascade transistor.

9. The driver of claim 8,
wherein the current provider further includes a diode connected in series to the resistor.

10. The driver of claim 6,
wherein the current provider is a resistor connected between the switching transistors and between the cascade transistors.

11. The driver of claim 6,
wherein the switching transistors and the cascade transistors are a type of hetero-bipolar transistor (HBT).

12. The driver of claim 6,
wherein the cascade transistors is coupled with the output delay lines by an open-collector arrangement.

13. The driver of claim 6,
wherein the idle current is 0.01 to 1 mA.

* * * * *